(12) United States Patent
Biswas

(10) Patent No.: US 12,261,578 B2
(45) Date of Patent: Mar. 25, 2025

(54) DEVICES AND METHODS FOR OFFSET CANCELLATION

(71) Applicant: STMicroelectronics International N.V., Geneva (CH)

(72) Inventor: Riju Biswas, Noida (IN)

(73) Assignee: STMicroelectronics International N.V., Geneva (CH)

( * ) Notice: Subject to any disclaimer, the term of this patent is extended or adjusted under 35 U.S.C. 154(b) by 407 days.

(21) Appl. No.: 17/891,860

(22) Filed: Aug. 19, 2022

(65) Prior Publication Data

US 2022/0407481 A1 Dec. 22, 2022

Related U.S. Application Data

(63) Continuation-in-part of application No. 16/837,783, filed on Apr. 1, 2020, now Pat. No. 11,444,580.

(51) Int. Cl.
*H03F 3/45* (2006.01)
*H03M 1/06* (2006.01)

(52) U.S. Cl.
CPC ..... *H03F 3/45977* (2013.01); *H03F 3/45753* (2013.01); *H03M 1/0607* (2013.01);
(Continued)

(58) Field of Classification Search
CPC ............ H03F 3/45977; H03F 3/45753; H03F 2200/375; H03F 2203/45212;
(Continued)

(56) References Cited

U.S. PATENT DOCUMENTS

| 6,429,697 B1 | 8/2002 | Anazeen et al. |
| 7,764,118 B2 | 7/2010 | Kusuda et al. |

(Continued)

FOREIGN PATENT DOCUMENTS

| EP | 2458731 A3 | 4/2017 |
| JP | H03102904 A | 4/1991 |

OTHER PUBLICATIONS

Enz, C. et al., "Circuit Techniques for Reducing the Effects of Op-Amp Imperfections: Autozeroing, Correlated Double Sampling, and Chopper Stabilization," Proceedings of the IEEE., vol. 84, No. 11, Nov. 1996, 31 pages.

(Continued)

*Primary Examiner* — Andrea Lindgren Baltzell
*Assistant Examiner* — Khiem D Nguyen
(74) *Attorney, Agent, or Firm* — Slater Matsil, LLP

(57) ABSTRACT

An offset-cancellation circuit having a first amplification stage with a gain of the first amplification stage and configured to receive an offset voltage of a first amplifier. A storage element is configured to be coupled to and decoupled from the first amplification stage and configured to store a potential difference output by the first amplification stage. The potential difference is determined by the offset voltage of the first amplifier and the gain of the first amplification stage. A second amplification stage is coupled to the storage element and configured to receive the potential difference from the storage element when the storage element is decoupled from the first amplification stage and configured to deliver an offset-cancellation current. The offset-cancellation current is determined by the potential difference and a gain of the second amplification stage.

20 Claims, 11 Drawing Sheets

(52) U.S. Cl.
CPC ..... *H03M 1/0682* (2013.01); *H03F 2200/375* (2013.01); *H03F 2203/45212* (2013.01)

(58) Field of Classification Search
CPC . H03F 2203/45038; H03F 2203/45044; H03F 2203/45152; H03F 2203/45588; H03F 3/45475; H03M 1/0607; H03M 1/0682; H03M 1/466
USPC ................................ 330/277, 253, 254, 258
See application file for complete search history.

(56) References Cited

U.S. PATENT DOCUMENTS

| | | |
|---|---|---|
| 7,764,215 B2 | 7/2010 | Wan et al. |
| 2009/0128238 A1 | 5/2009 | Lin et al. |
| 2010/0164770 A1 | 7/2010 | Wan et al. |
| 2020/0020282 A1* | 1/2020 | Chou ................... G09G 3/3291 |

OTHER PUBLICATIONS

Pertijs, M et al., "A 140 dB-CMRR Current-Feedback Instrumentation Amplifier Employing Ping-Pong Auto-Zeroing and Chopping," IEEE Journal of Solid-State Circuits, vol. 45, No. 10, Oct. 2010, 13 pages.

* cited by examiner

DEVICES AND METHODS FOR OFFSET CANCELLATION

CROSS-REFERENCE TO RELATED APPLICATIONS

This application is a continuation of U.S. patent application Ser. No. 16/837,783, entitled "DEVICES AND METHODS FOR OFFSET CANCELLATION," and filed on Apr. 1, 2020, which applications are hereby incorporated herein by reference.

TECHNICAL FIELD

Embodiments of the present invention relate generally to devices and methods to cancel the offset of an amplifier.

BACKGROUND

The performance of an amplifier may be impacted by an offset voltage. This can create inaccuracies in various contexts including an amplifier or amplifiers for a comparator in a Successive Approximation Register Analog to Digital Converter. Efforts to cancel a voltage offset may introduce unwanted noise. Amplifiers can benefit from offset-cancellation with limited noise.

SUMMARY

In accordance with an embodiment of the present invention, an offset-cancellation circuit includes a first amplification stage that includes a gain of the first amplification stage and is configured to receive an offset voltage of a first amplifier. The offset-cancellation circuit includes a storage element configured to be coupled to and decoupled from the first amplification stage and is configured to store a potential difference output by the first amplification stage, the potential difference being determined by the offset voltage of the first amplifier and the gain of the first amplification stage. The offset cancellation circuit includes a second amplification stage coupled to the storage element and configured to receive the potential difference from the storage element when the storage element is decoupled from the first amplification stage and configured to deliver an offset-cancellation current, the offset-cancellation current being determined by the potential difference and a gain of the second amplification stage.

In accordance with an embodiment of the present invention, an offset-cancellation circuit includes an input amplifier including a first input, a second input, a first output, and a second output. The offset-cancellation circuit includes a pre-storage amplifier including a first input and a second input. The offset-cancellation circuit includes a post-storage amplifier including a first input coupled with a first plate of a first storage capacitor and including a second input coupled with a first plate of a second storage capacitor.

In a first state of the offset-cancellation circuit the first input of the input amplifier and the second input of the input amplifier are coupled to a common mode to produce a voltage offset between the first output of the input amplifier and the second output of the input amplifier; the first input of the pre-storage amplifier is coupled to the first output of the input amplifier and the second input of the pre-storage amplifier is coupled to the second output of the input amplifier; and the first plate of the first storage capacitor is coupled with a first output of the pre-storage amplifier and the first plate of the second storage capacitor is coupled with a second output of the pre-storage amplifier. In the first state of the offset-cancellation circuit, a first potential is stored on the first storage capacitor and a second potential is stored on the second storage capacitor, a difference between the first potential and the second potential is proportional to the voltage offset.

In a second state of the offset-cancellation circuit the first plate of the first storage capacitor is decoupled from the first output of the pre-storage amplifier; the first plate of the second storage capacitor is decoupled from the second output of the pre-storage amplifier; and a first output of the post-storage amplifier is coupled with the first output of the input amplifier and a second output of the post-storage amplifier is coupled with the second output of the input amplifier to provide a first offset-cancellation current to the first output of the input amplifier and a second offset-cancellation current to the second output of the input amplifier, the first offset-cancellation current and the second offset-cancellation current determined by the first potential and by the second potential.

In accordance with an embodiment of the present invention, a method to cancel an offset voltage of an amplifier includes generating the offset voltage between a first output of the amplifier and a second output of the amplifier by coupling a first input of the amplifier and a second input of the amplifier to a common mode. The method includes receiving the offset voltage at a first input of a first amplification stage and a second input of the first amplification stage. The method includes storing a potential difference determined by a first gain of the first amplification stage and the offset voltage in a storage element configured to be coupled and decoupled with a first output of the first amplification stage and a second output of the first amplification stage. The method includes decoupling the storage element from first amplification stage and providing the potential difference between a first input of a second amplification stage and a second input of the second amplification stage, the second amplification stage comprising a second gain. The method includes providing an offset-cancellation current to the first output of the amplifier and the second output of the amplifier from a first output of the second amplification stage and a second output of the second amplification stage, the offset-cancellation current determined by the second gain and the potential difference and wherein the offset-cancellation current comprises a first current at the first output of the second amplification stage and a second current at the second output of the second amplification stage.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 1:
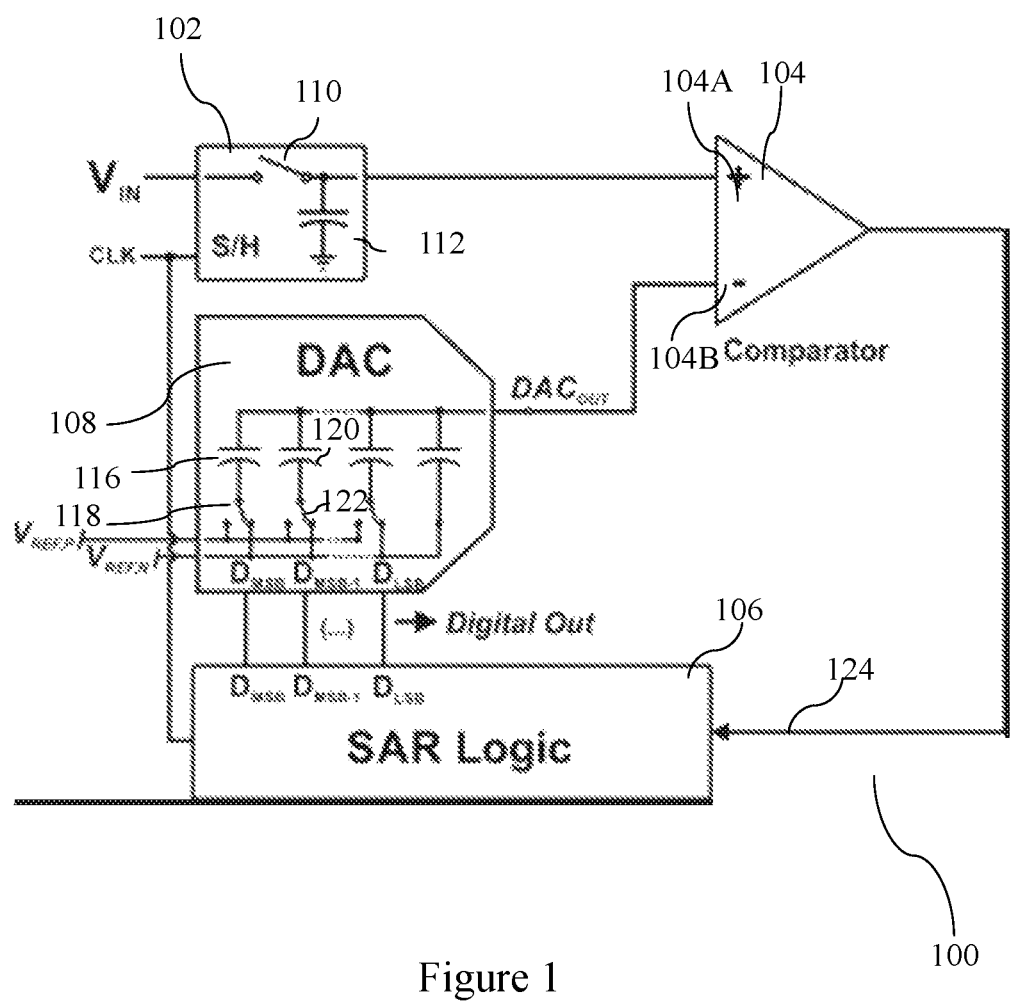
FIG. 1 illustrates an embodiment of a successive approximation register.

The making and using of embodiments of this disclosure are discussed in detail below. It should be appreciated, however, that the concepts disclosed herein can be embodied in a wide variety of specific contexts, and that the specific embodiments discussed herein are merely illustrative and do not serve to limit the scope of the claims. Further, it should be understood that various changes, substitutions and alterations can be made herein without departing from the spirit and scope of this disclosure as defined by the appended claims.

Throughout the present disclosure, the term "connected and derivations thereof is used to designate a direct electrical connection between circuit elements with no intermediate elements other than conductors, whereas the term "coupled" and derivations thereof is used to designate an electrical connection between circuit elements that may be direct, or may be via one or more intermediate elements.

Embodiments of the present application disclose devices and methods to cancel the offset of an amplifier. Amplifiers are common electrical components utilized in many types of electrical devices. Examples include the pre-amplifier stage of a comparator for a successive approximation register. Physical variations among the components of an amplifier may lead to a performance variation of an amplifier that is characterized by an input voltage offset. Offsets can cause inaccuracies and other performance issues for an electrical device where an amplifier is utilized. Cancelling the offset and limiting offset-cancellation noise may improve the accuracy and performance of a device employing an amplifier.

An example of an application of an amplifier that may benefit from offset cancellation is found in a Successive Approximation Register ("SAR") Analog to Digital Converter ("ADC"). A SAR ADC operates by making a series of successive comparisons between an analog input and a reference value to generate a digital value corresponding to the analog input. Each comparison of the series of comparisons corresponds to a bit of the corresponding bit value beginning with the most significant bit and ending with the least significant bit.

At a first comparison, a digital test value is set to "1" while each of the remaining bits is assigned a "0." An analog conversion of the digital test value is compared with the analog input value. If the analog conversion of the digital test value is less than the analog input, the most significant bit keeps a "1" for the next comparison; otherwise bit is switched to a "0."

A second comparison follows where the second most significant bit of the digital test value is now set to "1," and the value for the most significant bit keeps the value it received from the first comparison. This new digital test value is converted to an analog signal and compared with the analog input. If the converted analog value is less than the analog input, the second most significant bit stays at "1" for the next comparison. Otherwise, the second most significant bit switches to "0."

A third comparison follows where the third most significant bit of the digital test value is set to "1" and the values for the first and second most significant bits are kept from the first two comparisons. Like the preceding comparisons, this digital test value is converted to an analog signal. And, once again, the converted analog test value is compared with the analog input. If the converted test value is less than the analog input, the value of the third most significant bit keeps a "1." If the converted value is greater than the analog input, the third most significant bit is switched to "0." Additional comparisons can continue until the least significant bit is reached and a value is set for each bit. The digital value generated corresponds to a digital value converted from the analog input of the SAR ADC.

By way of example, a 4-bit SAR ADC will make four successive comparisons to arrive at a digital value approximating the analog input value. At a first comparison, the most significant bit is set to "1" while the remaining three bits are set to "0." If a reference value is 16V the resulting digital value "1000" converts to an analog value of 8V. If the analog input is 13.5V, analog test value of 8V is less than the analog input, 13.5V. As a result, the most significant bit for the next comparison keeps a "1."

At a second comparison, the second most significant bit is set to "1" and the most significant bit maintains its value from the previous comparison. The resulting value, "1100" converts to 12V, which is still less than the 13.5V input so the second most significant bit keeps a "1."

At a third comparison, the third most significant bit is set to "1" and the results from the previous comparisons are kept. The resulting value "1110" converts to 14V. This time, the resulting test value, 14V, is greater than the 13.5V input so the third most significant bit switches to a "0."

At a final comparison, the previous results are kept, and the least significant bit is set to "0." The resulting value "1101" converts to 13V, which is less than the 13.5V input. The least significant bit is set to "1" and the final result of the ADC is "1101." The examples provided above are for illustrative purposes only. Other embodiments of a SAR ADC may vary in various ways. Some may have more or less bits or different reference values. The more bits and comparisons, the more accurate a conversion process may be.

FIG. 1 illustrates an embodiment of a successive approximation register (SAR) analog to digital converter (ADC). The SAR ADC 100 in the embodiment depicted in FIG. 1 comprises a sample-and-hold ("S/H") circuit 102, a comparator 104, a SAR Logic circuit 106, and a Digital to Analog Converter ("DAC") 108. In the SAR ADC 100 depicted in FIG. 1, the comparator 104 receives a value, $V_{in}$, at a first input 104A and compares it a second value received at a second input 104B. As described in more detail elsewhere in various embodiments, the value received at the second input 104B is adjusted through the successive approximation process and the results are fed back to the SAR Logic circuit 106.

In some embodiments, the S/H circuit 102 and the SAR Logic circuit 106 may be timed by a CLK signal. Further, in some embodiments, the digital output of the SAR ADC may be disposed at the out the output of the SAR Logic circuit 106.

In embodiments, the S/H circuit 102 of the SAR ADC 100 may be coupled to $V_{in}$ by switch 110 in a first mode of operation. This mode of operation may be referred to as a sample mode. During the sample mode, $V_{in}$ may be sampled and stored in the S/H circuit 102. $V_{in}$ can be stored in the S/H circuit 102 in different ways. In some embodiments, the sampled voltage may be stored on a capacitor or a capacitor network. In FIG. 1, a storage element 112 is represented by a capacitor. In some embodiments, different architectures may utilize different embodiments of the storage element 112.

In a second mode of operation, a conversion mode, switch 110 may be opened to hold the value of $V_{in}$ in the storage element 112. This value can then be provided to a first input 104A of a comparator 104 in a conversion mode for successive approximations to arrive at a digital value converted from an analog input as described elsewhere in this disclosure. In some embodiments, the switch 110 may be controlled by a CLK signal.

Also during the conversion mode, the SAR Logic circuit 106 may provide a digital value to the DAC 108 that is converted to an analog value based on the reference voltage ($V_{REF,P}$, $V_{REF,N}$). In some embodiments, the analog output of the DAC is provided to the second input 104B of the comparator 104 and used for comparison with $V_{in}$. The results of the comparison may be fed back to the SAR Logic circuit 106 to accomplish a successive comparison process like described elsewhere in this application. In the embodiment depicted in FIG. 1, the output 124 of the comparator 104 may be fed back to the SAR Logic circuit 106.

During a first comparison, the most significant bit $D_{msb}$ of the SAR Logic circuit 106 may be set to a "1." A resulting digital signal, which for a 4-bit SAR ADC would be "1000" as described elsewhere, is provided to the DAC 108. A value corresponding to half a reference voltage can be stored on a capacitor 116 corresponding to the most significant bit by toggling a switch 118 between $V_{REF,P}$ and $V_{REF,N}$. This value is provided to the second input 104B of the comparator 104 and compared with $V_{in}$. Depending on the results of the comparison, the voltage on the capacitor 116 may be kept or removed by toggling switch 118.

During the second comparison, $D_{msb-1}$ is set to "1" and a value corresponding to one fourth the reference voltage can be stored capacitor 120 by toggling switch 122 appropriately. The sum of the charge on capacitor 116 and capacitor 120 is provided to the comparator 104. Once again, the results are fed back to SAR Logic circuit 106. And, successive comparisons continue for each bit of the SAR ADC 100.

It is noted that there are a variety of additional architectures for SAR ADCs known in the art including, but not limited to, charge-redistribution based architectures. For example, in some embodiments of a SAR ADC, a single capacitor network can serve as an S/H circuit and a capacitor array for a DAC circuit. In some embodiments, a first input 104A of a comparator 104 may be coupled with an output of a capacitor network while a second input 104B may be coupled to ground. In some embodiments, a first input 104A of a comparator 104 and a second input 104B of the comparator 104 may be coupled to outputs of a single capacitor network. In some embodiments, a first input 104A of a comparator 104 may be coupled to a first capacitor network, and a second input 104B of a comparator may be coupled with a second capacitor network.

As described above, the comparator 104 of the SAR ADC of FIG. 1 is used to compare two analog inputs for a successive approximation process. Improving the accuracy and speed of a comparator 104 may improve the accuracy and speed of many embodiments of a SAR ADC.

In some embodiments, the comparator 104 of a SAR ADC comprises a latch comparator.

Figure 2:
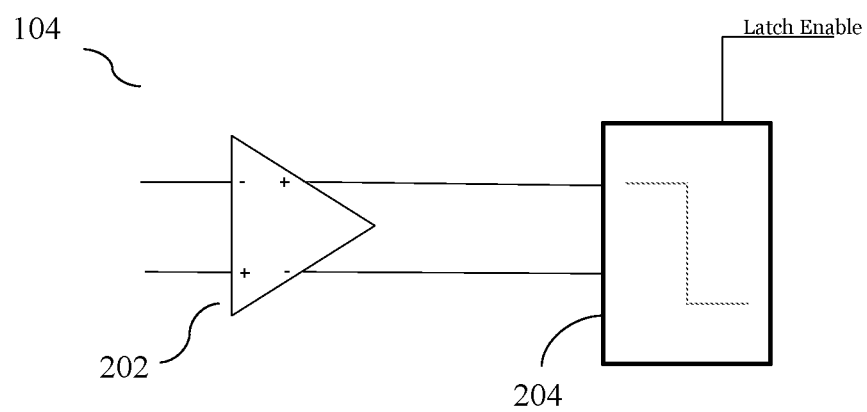
FIG. 2 illustrates an embodiment of a comparator.

FIG. 2 illustrates an embodiment of a comparator 104.

As shown in FIG. 2, the comparator 104 may comprise a preamplifier 202 and a latch 204. The offset of the latch 204 of the comparator 104 may be countered by the gain of the preamplifier 202. And, the preamplifier 202 reduces kick back coming from the latch 204 during a conversion phase of a SAR ADC. A preamplifier 202 may introduce unwanted noise and offset to the comparator 104. The latch 204 may also be configured to receive an enabling signal.

In some embodiments, an offset-cancellation circuit 300 may cancel the offset introduced by an amplifier while limiting noise.

Figure 3:
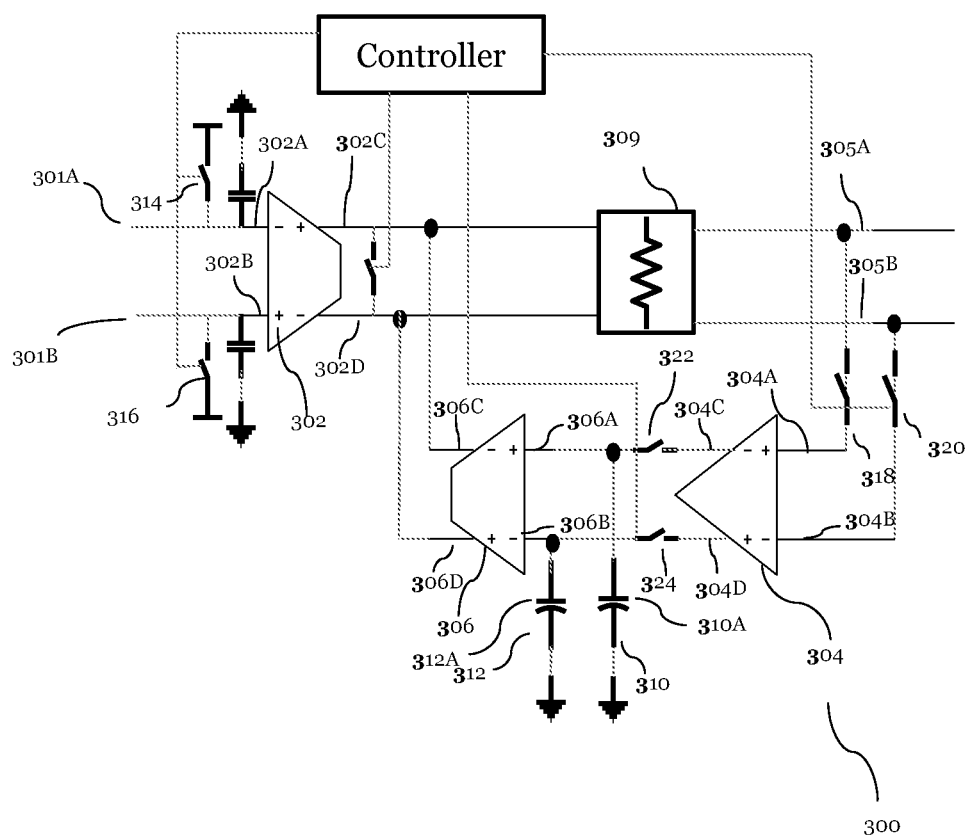
FIG. 3 illustrates an embodiment of an offset-cancellation circuit.

FIG. 3 depicts an embodiment of an offset-cancellation circuit 300 to cancel the offset of an amplifier. In various embodiments, the offset-cancellation circuit 300 comprises a first input of the offset-cancellation circuit 301A and a second input of the offset-cancellation circuit 301B. The offset-cancellation circuit 300 may also comprise a first output of the offset-cancellation circuit 305A and a second output of the offset-cancellation circuit 305B.

In some embodiments, an offset-cancellation circuit 300 comprises a first amplifier 302. The first amplifier 302 may be characterized by a transconductance $G_{m1}$. In some embodiments, the first amplifier 302 may comprise an operational transconductance amplifier. The first amplifier 302 may comprise a first input of the first amplifier 302A and a second input of the first amplifier 302B. The first amplifier 302 may also comprise a first output of the first amplifier 302C and a second output of the first amplifier 302D.

In some embodiments, the offset-cancellation circuit 300 further comprises a pre-storage amplifier 304. The pre-storage amplifier 304 may comprise an operational amplifier. The pre-storage amplifier 304 may have a gain $A_1$. The pre-storage amplifier 304 may comprise a first pre-storage amplifier input 304A and a second pre-storage amplifier input 304B. The pre-storage amplifier 304 may also comprise a first pre-storage amplifier output 304C and a second pre-storage amplifier output 304D. In some embodiments, the first pre-storage amplifier input 304A is coupled to the first output of the first amplifier 302C and the second pre-storage amplifier input 304B is coupled to the second output of the first amplifier 302D.

In some embodiments, the offset-cancellation circuit 300 further comprises a post-storage amplifier 306. The post-storage amplifier 306 may comprise an operational transconductance amplifier. The post-storage amplifier 306 may have a transconductance $G_{m3}$. The post-storage amplifier 306 may comprise a first post-storage amplifier input 306A and a second post-storage amplifier input 306B. The post-storage amplifier 306 may also comprise a first output of the post-storage amplifier 306C and a second output of the post-storage amplifier 306D.

In some embodiments, the first post-storage amplifier input 306A is coupled to a first plate 310A of a first storage capacitor 310 and the second post-storage amplifier input 306B is coupled to a first plate 312A of a second storage capacitor 312. And, in some embodiments the first output of the post-storage amplifier 306C is coupled to the first output of the first amplifier 302C and the second output of the post-storage amplifier 306D is coupled to the second output of the first amplifier 302D.

Figure 4:
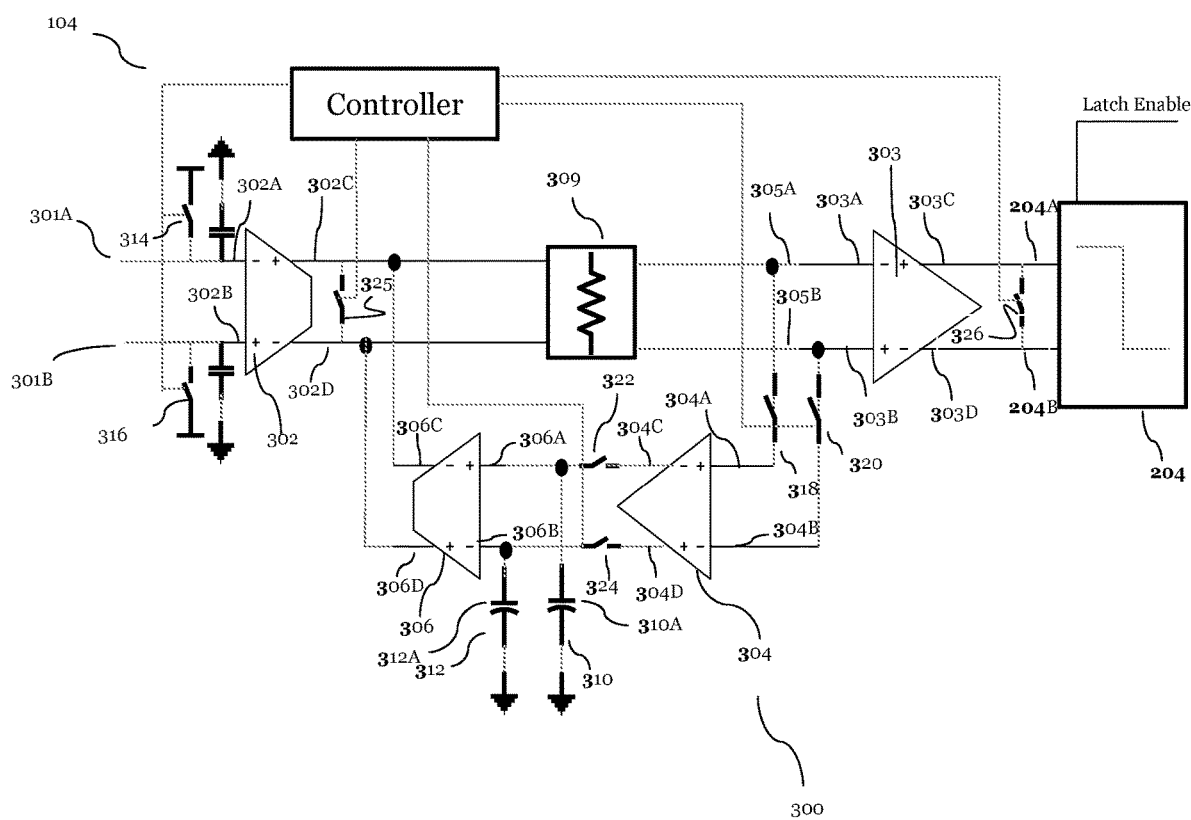
FIG. 4 illustrates an embodiment of a comparator with an offset-cancellation circuit.

FIG. 4 illustrates an embodiment of a comparator 104 with an offset-cancellation circuit 300. In some embodiments, the output or outputs of the offset-cancellation circuit 300 may be coupled with a second amplifier 303. In some embodiments, the second amplifier 303 comprises an operational amplifier.

In some embodiments, the second amplifier 303 comprises a first input of the second amplifier 303A, a second input of the second amplifier 303B, a first output of the second amplifier 303C, and a second output of the second amplifier 303D. A first output of the offset-cancellation circuit 305A may be coupled to the first input of the second amplifier 303A. A second output of the offset-cancellation circuit 305b may be coupled to the second input of the second amplifier 303B.

In some embodiments, the first output of the second amplifier 303C is coupled to a first input of a latch 204A, and the second output of the second amplifier 303D is coupled to a second input of a latch 204B. The offset-cancellation circuit 300 and the second amplifier 303 may operate as a preamplifier circuit of a comparator 104.

In some embodiments, the first input of the offset-cancellation circuit 301A may also comprise the first input 104A of the comparator 104. And, the second input of the offset-cancellation circuit 301B may comprise the second input 104B of the comparator 104.

In some embodiments, the first input of the offset-cancellation circuit 301A may be coupled to an output of an S/H circuit of a SAR ADC and a second input of the offset-cancellation circuit 301B may be coupled to the output of a DAC of a SAR ADC as the first input 104A and second input 104B of the comparator. It should be noted that the applications of the offset-cancellation circuit are not limited to SAR ADCs.

As described elsewhere, in some embodiments of a SAR ADC a single capacitor network can serve as a S/H circuit and a capacitor array for a DAC circuit. In some embodiments, the first input of the offset-cancellation circuit 301A may be coupled with an output of a capacitor network while the second input of the offset-cancellation circuit 301B may be coupled to ground. In some embodiments, the first input of the offset-cancellation circuit 301A and the second input of the offset-cancellation circuit 301B may be coupled to outputs of a single capacitor network as the first input 104A and second input 104B of the comparator 104 of a SAR ADC. In some embodiments, the first input of the offset-cancellation circuit 301A may be coupled to a first capacitor network, and a second input of the offset-cancellation circuit 301B may be coupled with a second capacitor network as the first input 104A and second input 104B of the comparator 104 of a SAR ADC.

Figure 5:
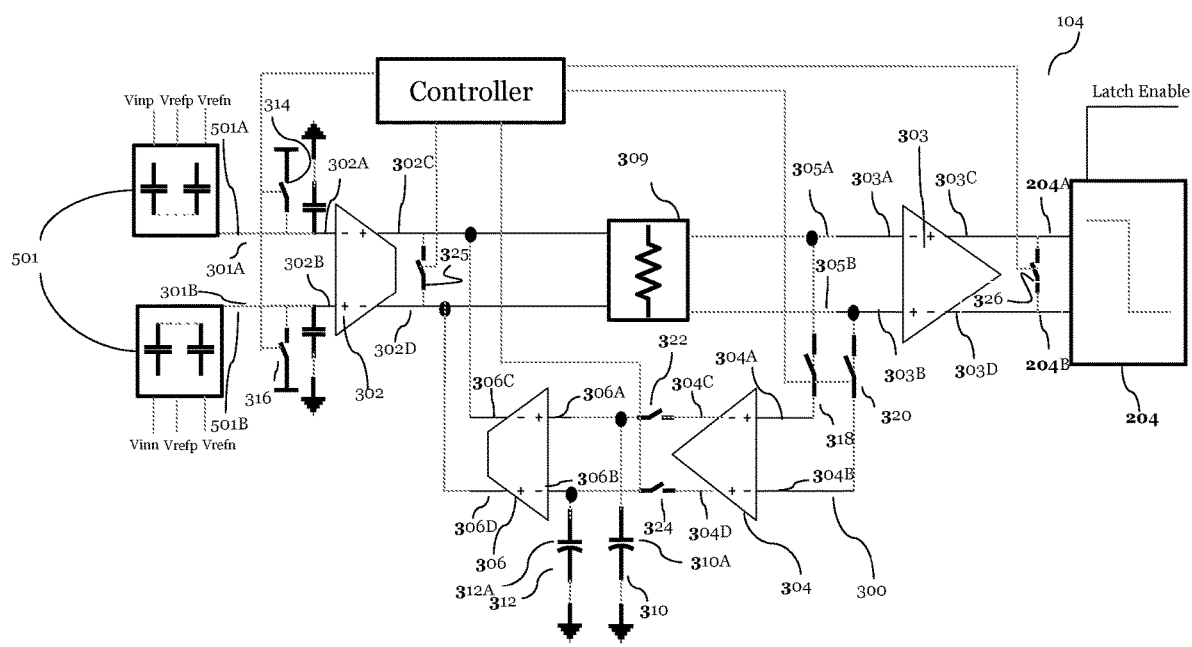
FIG. 5 illustrates an embodiment of an a comparator with an offset-cancellation circuit coupled with a capacitor network.

FIG. 5 illustrates an embodiment of a comparator 104 with an offset-cancellation circuit 300 coupled with a capacitor network 501. In some embodiments, the capacitor network 501 comprises both the S/H circuit of a SAR ADC and a DAC of a SAR ADC as described elsewhere. A first output of the capacitor network 501A may be coupled with a first input of the offset-cancellation circuit 301A. A second output of the capacitor network 501B may be coupled with a second input of the offset-cancellation circuit 301B.

In some embodiments, the offset-cancellation circuit 300 may be configured to operate in a first state and a second state. In some embodiments, in the first state, the first input of the first amplifier 302A and the second input of the first amplifier 302B may be coupled to a common mode. Coupling the first input of the first amplifier 302A and the second input of the first amplifier 302B to a common mode may produce a voltage between the first output of the first amplifier 302C and the second output of the first amplifier 302D. The voltage may be caused by factors including, but not limited to, non-ideal variations among the components of the first amplifier 302.

In embodiments wherein the first amplifier 302 comprises an operational transconductance amplifier, the current at the first output of the first amplifier 302C and the current at the second output of the first amplifier 302D may be determined by the transconductance of the first amplifier 302 and the input voltage offset of the first amplifier 302.

While in the first state where the first input of the first amplifier 302A and the second input of the first amplifier 302B are coupled to a common mode, the voltage between the first output of the first amplifier 302C and the second output of the first amplifier 302D may be received by the pre-storage amplifier 304 between the first input of the pre-storage amplifier 304 and the second pre-storage amplifier input 304B. This may be amplified according to the operation of the pre-storage amplifier 304 to produce an amplified voltage between the first pre-storage amplifier output 304C and the second pre-storage amplifier output 304D.

During the first state, a first potential may be stored on the first storage capacitor 310 and a second potential may be stored on the second storage capacitor 312. The difference between the first potential and the second potential may be proportional to the voltage seen during the first state between the first output of the first amplifier 302C and the second output of the first amplifier 302D.

This allows an amplified value corresponding to the voltage between the first output of the first amplifier 302C and the second output of the first amplifier 302D to be stored in the offset-cancellation circuit 300 on the first storage capacitor 310 and the second storage capacitor 312 after being amplified by the gain $A_1$ of the pre-storage amplifier 304.

In some embodiments, the first input of the first amplifier 302A may be coupled to the common mode by a first switch 314 that is closed in the first state. In some embodiments, the second input of the first amplifier 302B may be coupled to the common mode by a second switch 316 that is closed in the first state. In alternative embodiments, the first input of the first amplifier 302A and the second input of the first amplifier 302B are coupled to the common mode by a single switch that is closed in the first state. In some such embodiments, the first input of the first amplifier 302A is coupled to the second input of the first amplifier 302B by the single switch, which is closed in the first state to couple the first input of the first amplifier 302A and the second input of the first amplifier 302B to the common mode.

In some embodiments, the first pre-storage amplifier input 304A may be coupled to the first output of the first amplifier 302C by a first pre-storage switch 318. The first pre-storage switch 318 may be closed in the first state. In some embodiments, the second pre-storage amplifier input 304B may be coupled to the second output of the first amplifier 302D by a second pre-storage switch 320. The second pre-storage switch 320 may be closed in the first state.

In some embodiments, the first pre-storage amplifier output 304C may be coupled to the first plate 310A of the first storage capacitor 310 by a third pre-storage switch 322. The third pre-storage switch 322 may be closed in the first state. In some embodiments, the second pre-storage amplifier output 304D may be coupled to the first plate 312A of the second storage capacitor 312 by a fourth pre-storage switch 324. The fourth pre-storage switch 324 may be closed in the first state.

In some embodiments, the first switch 314 receives a control signal from a controller to toggle the first switch 314 between open and closed states. The second switch 316 may receive a control signal from a controller to toggle the second switch 316 between open and closed states. In embodiments wherein the first input of the first amplifier 302A and the second input of the first amplifier 302B are coupled to the common mode by a single switch, the single switch may receive a control signal from a controller to toggle the single switch between open and closed states.

In some embodiments, the first pre-storage switch 318 may receive a control signal from a controller to toggle the first pre-storage switch 318 between an open state and a closed state. The second pre-storage switch 320 may receive a control signal from a controller to toggle the second pre-storage switch 320 between an open state and a closed state. In some embodiments, the third pre-storage switch 322 may receive a control signal from a controller to toggle the third pre-storage switch 322 between an open state and a closed state. The fourth pre-storage switch 324 may receive a control signal from a controller to toggle the fourth pre-storage switch 324 between an open state and a closed state.

In some embodiments, the offset-cancellation circuit 300 may comprise the controller. In some embodiments the controller may not be part of the offset-cancellation circuit.

Figure 6:
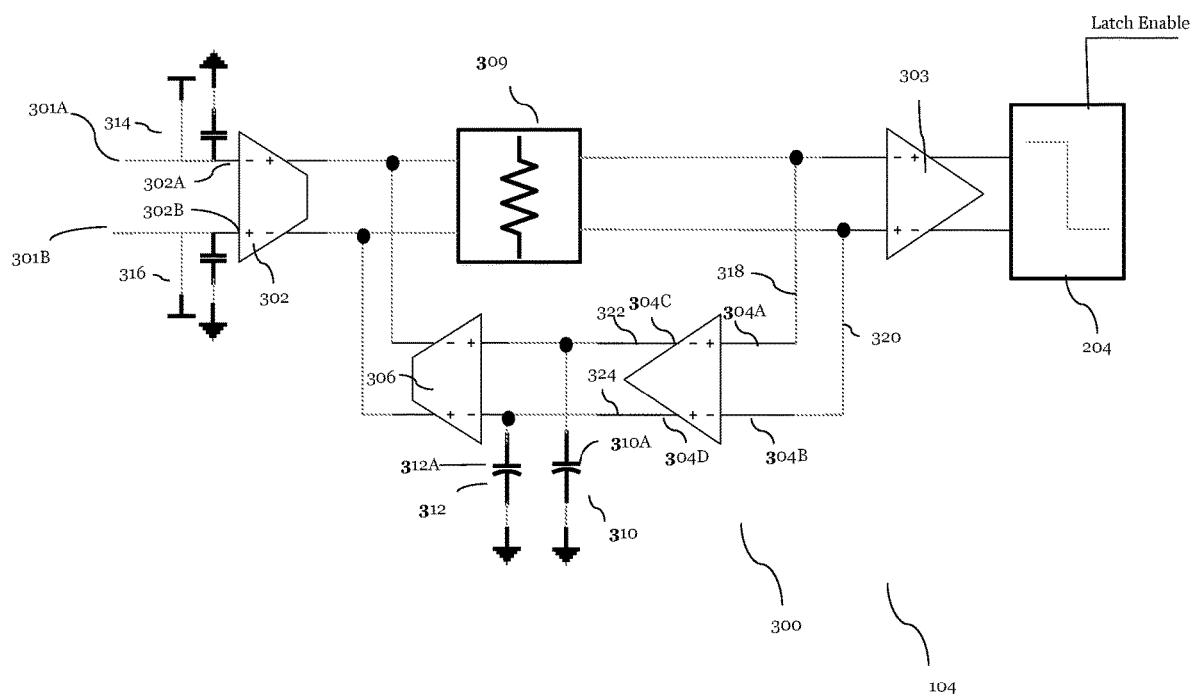
FIG. 6 illustrates an embodiment of a comparator with an offset-cancellation circuit in a first state.

FIG. 6 illustrates an embodiment of a comparator 104 with an offset-cancellation circuit 300 in a first state. In the embodiment of the offset-cancellation circuit 300 depicted in FIG. 6, the offset-cancellation circuit 300 may be part of a comparator 104. In some embodiments of the offset-cancellation circuit 300 in the first state, the first switch 314 and second switch 316 are closed thereby coupling the first input of the first amplifier 302A and the second input of the first amplifier 302B to the common mode. The first pre-storage switch 318 and the second pre-storage switch 320 may also be closed coupling the first pre-storage amplifier input 304A to the first output of the first amplifier 302C and the second pre-storage amplifier input 304B to the second output of the first amplifier 302D. Also, the third pre-storage switch 322 and the fourth pre-storage switch 324 may be closed coupling the first pre-storage amplifier output 304C to the first plate 310A of the first storage capacitor 310 and the second pre-storage amplifier output 304D to the first plate 312A of the second storage capacitor 312.

Figure 7:
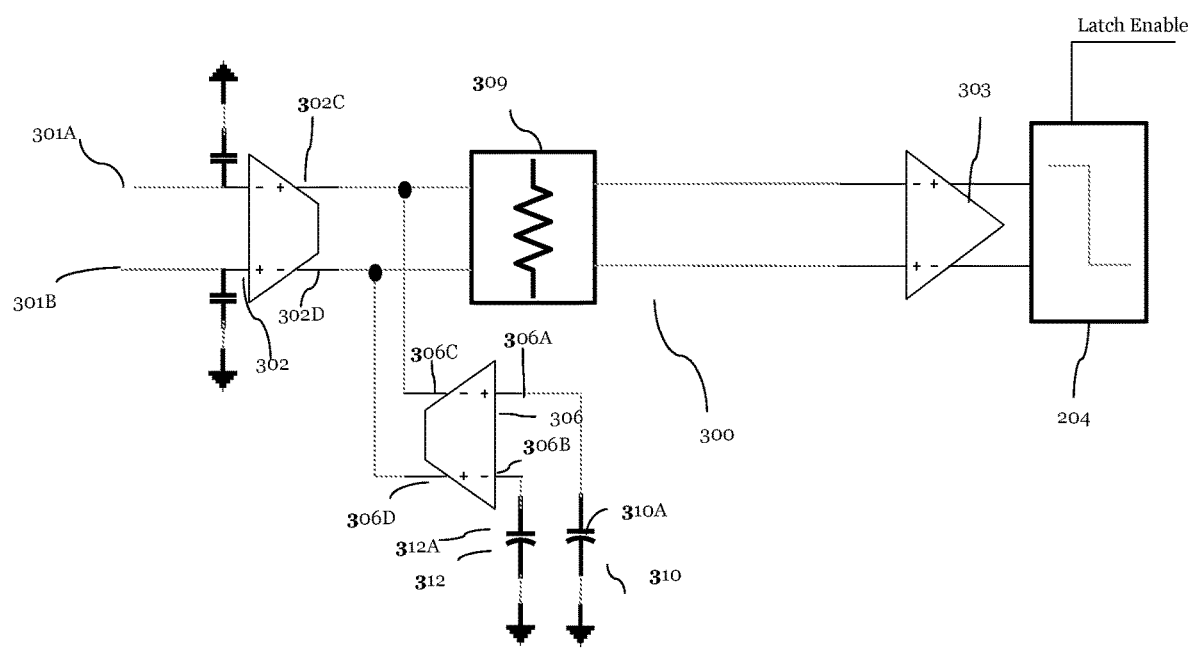
FIG. 7 illustrates an embodiment of a comparator with an offset-cancellation circuit in a second state.

FIG. 7 illustrates an embodiment of a comparator 104 with an offset-cancellation circuit 300 in a second state. As described elsewhere, in the second state, some components have been electrically isolated from the offset-cancellation circuit 300 and have been removed from FIG. 7 to illustrate the operation of the offset-cancellation circuit 300 in the second state.

In some embodiments of the offset-cancellation circuit in the second state, the first switch 314 and second switch 316 may be open thereby de-coupling the first input of the first amplifier 302A and the second input of the first amplifier 302B from the common mode. The first pre-storage switch 318 and the second pre-storage switch 320 may also be open thereby decoupling the first pre-storage amplifier input 304A from the first output of the first amplifier 302C and decoupling the second pre-storage amplifier input 304B from the second output of the first amplifier 302D. Also, the third pre-storage switch 322 and the fourth pre-storage switch 324 may have been opened thereby decoupling the first pre-storage amplifier output 304C from the first plate 310A of the first storage capacitor 310 and decoupling the second pre-storage amplifier output 304D to the first plate 312A of the second storage capacitor 312. In this configuration, the pre-storage amplifier 304 may be electrically isolated from the offset-cancellation circuit 300.

In the second state, the first potential stored on the first storage capacitor 310 during this first state is applied to the first post-storage amplifier input 306A. Likewise, the second potential stored on the second storage capacitor 312 during the first state is applied to the second post-storage amplifier input 306B. The post-storage amplifier 306 may thus see the difference between the first potential and the second potential at its inputs. And, this difference may be amplified by the transconductance of the post-storage amplifier 306, $G_{m3}$.

The current at first output of the post-storage amplifier 306C and the second output of the post-storage amplifier 306D may be a function of the voltage between the first output of the first amplifier 302C and the second output of the first amplifier 302D during the first state, the gain of the pre-storage amplifier 304, and the transconductance of the post-storage amplifier. The current the first output of the post-storage amplifier 306C and the second output of the post-storage amplifier 306D may be an offset-cancellation currents and can be provided to the first output of the first amplifier 302C and the second output of the first amplifier 302D in the second state to cancel the offset of the first amplifier 302 when the offset-cancellation circuit 300 is in the second state.

Splitting the gain in the offset-cancellation circuit 300 seen from the pre-storage amplifier 304 and the post-storage amplifier 306 into two stages allows the offset-cancellation circuit 300 flexibility to have a first gain during the first state and a second gain during the second state. In some embodiments, the pre-storage amplifier 304 may comprise a first amplification state and the post storage amplifier 306 may comprise a second amplification stage. This may be advantageous because a high gain may be desirable to reduce the input offset of the offset-cancellation circuit 300 while a low gain may be desirable to reduce the input referred noise of the offset-cancellation circuit 300. Thus, the offset-cancellation circuit may realize the benefits of a higher gain for offset cancellation while limiting noise by isolating the pre-storage amplifier 304 may from the offset-cancellation circuit 300 when lower input offset noise may be desired.

This relationship can be seen by equations describing the input referred offset and the input referred noise may of some embodiments of the offset-cancellation circuit 300. The input referred offset of the offset-cancellation circuit 300 may be described by Equation 1:

$$\text{Input Refered Offset} = \qquad \text{(Equation 1)}$$
$$\frac{Vout}{Gm_1 R} = \frac{Vos_1}{1 + A1 Gm_3 R} + \frac{A_1 Gm_3}{Gm_1} * \frac{Vos_2}{1 + A_1 Gm_3 R}$$

In Equation 1, Vout is to the voltage at the output of the offset-cancellation circuit 300 between 305A and 305B. Vo1 is the input offset of the first amplifier 302, Vos2 is the input offset of the post-storage amplifier 306, $A_1$ is the voltage gain of the pre-storage amplifier 304, $G_{m1}$ is the transconductance of the first amplifier 302, where $G_{m3}$ is the transconductance of the post-storage amplifier 306, and R is the resistance seen at resistance block 309. The input offset may be approximated by Equation 2:

$$\text{Input Referred Offset} \sim \frac{Vos_1}{A_1 Gm_3 R} + \frac{Vos_2}{Gm_1 R} \quad \text{(Equation 2)}$$

The input offset noise of the offset-cancellation circuit 300 in the second state may be described by Equation 3:

$$\text{Input Referred Noise} = f\left(\frac{1}{Gm1} + \frac{G_{m3}}{G_{m1}^2}\right) \quad \text{(Equation 3)}$$

Equation 1 and Equation 2 make it clear that the input referred offset of the offset-cancellation circuit can be reduced by increasing the term $A_1 * G_{m3}$. Also, isolating the pre-storage amplifier 304 from the offset-cancellation circuit 300 in the second state removes the influence of $A_1$ from the input referred noise, which is why it not seen in Equation 3. Thus, the input referred offset can be reduced with $A_1$ without sacrificing improvements in the input referred noise.

This may also be advantageous in the context of a SAR ADC. As described elsewhere, a SAR ADC may operate in a sample mode to sample the value of the analog input and a conversion mode where a series of successive comparisons are made to convert an analog input value into a digital value. In some embodiments, the offset-cancellation circuit 300 can be utilized in a comparator for a SAR ADC. The offset-cancellation circuit 300 can be configured to operate in the first state during some, or all, of the sample mode to lower the effective input offset voltage generated by the comparator. Then, during the conversion phase, when noise cancellation may be more of an issue, the offset-cancellation circuit 300 can be switched to the second state to isolate the pre-storage amplifier 304 and remove the impact of $A_1$ on input referred noise.

Figure 8:
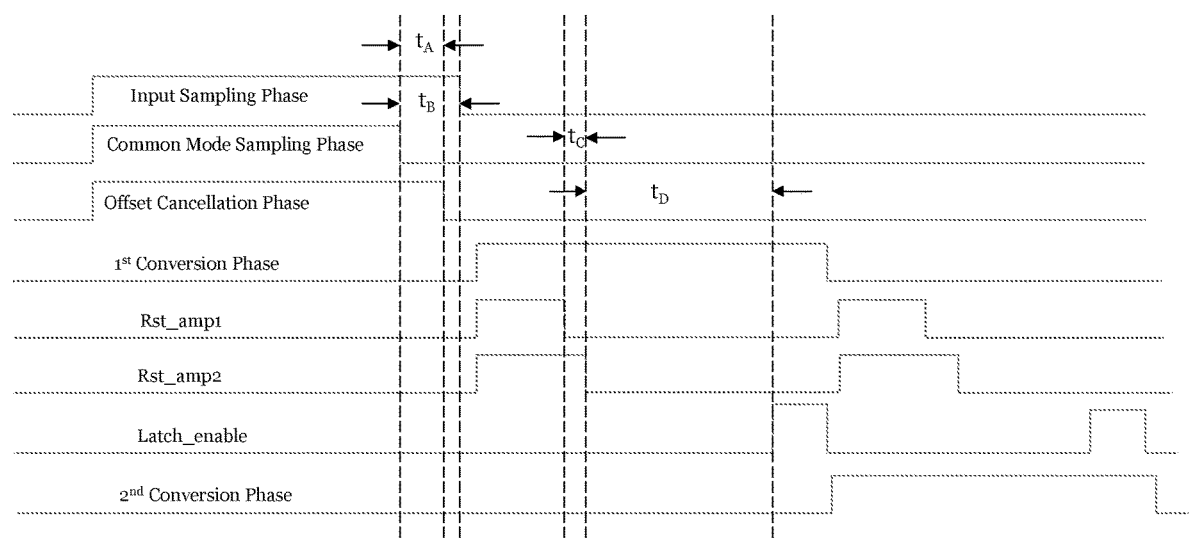
FIG. 8 illustrates of a configuration of control signals that may operate an embodiment an offset-cancellation circuit of a comparator of a Successive Approximation Register Analog to Digital converter.

FIG. 8 illustrates a configuration of control signals that may operate an embodiment of the offset-cancellation circuit 300 as part of a comparator of a SAR ADC. An input sampling phase signal shown in FIG. 8 may toggle a SAR ADC in and out of the input sampling phase. As depicted in FIG. 8, a high input sampling phase signal may set the phase of the SAR ADC to the input sampling phase. This may be accomplished in many ways known in the art.

In one embodiment, the input sampling phase signal may be coupled with a switch or configuration of switches that couple an S/H circuit 102 with a voltage input to sample and store the input in the S/H circuit 102. In some embodiments, switch 110 from FIG. 1 may receive the input sampling phase signal to couple to S/H circuit 102 with the voltage input to the SAR ADC when the input sampling phase is high.

In some embodiments, the Common Mode Sampling Phase signal from FIG. 8 may be coupled to first switch 314 and the second switch 316. When the Common Mode Sampling Phase is high, the first switch 314 and the second switch 316 may closed and couple the first input of the first amplifier 302A and the second input of the first amplifier 302B to the common mode.

The Offset Cancellation Phase signal from FIG. 8 may be coupled to the first pre-storage switch 318, the second pre-storage switch 320, the third pre-storage switch 322, and the fourth pre-storage switch 324. Each may be closed when the Offset Cancellation Phase signal is high and opened when the Offset Cancellation Phase signal is low thereby isolating the pre-storage amplifier 304 from the offset-cancellation circuit 300 and limiting the input referred noise during conversion phases of the SAR ADC.

The timing configuration depicted in FIG. 8 also includes a delay, $t_A$, between the signal decoupling of the first input of the first amplifier 302A and the second input of the first amplifier 302B from the common mode and the signal isolating the pre-storage amplifier 304 from the offset-cancellation circuit 300. This delay helps in storing the charge generated from the charge injection mismatch from the two common mode sampling switches.

The timing configuration depicted in FIG. 8 also includes a delay, $t_b$, between the end of the Common Mode Sampling Phase and the end of the Input Sampling Phase. This delay is for bottom plate sampling. In various embodiments, for bottom plate sampling, first switch 314 and second switch 316 may be turned off before an input sampling switch is coupled to the input sampling phase signal. When the first switch 314 and second switch 316 turn off the capacitors of the capacitor network 501 become floating. So, the charge injected by the input sampling switch coupled to the input sampling phase signal, which is a function of input voltage, cannot impact the voltage of the sampling capacitance.

In some embodiments, the comparator 104 of FIG. 4 may further comprise a first reset switch 325 and a second reset switch 326. The first reset switch 325 may receive the Rst_amp1 signal shown in FIG. 8. The second reset switch 326 may receive the Rst_amp2 signal shown in FIG. 8. The first reset switch 325 may be closed when the Rst_amp1 signal is high, and the second reset switch 326 may be closed when Rst_amp2 signal is high. The first reset switch 325 and the second reset switch 326 may place the comparator 104 in a reset state. In some embodiments, at the onset of each conversion phase, the comparator 104 remains in reset state. In this reset state, the capacitor network 501 settles to a value according to the control signals. After the capacitance network settles to the final value, the comparator 104 comes out of the reset phase. This ensures that the comparator 104 gets the correct input value for amplification. Otherwise, it will start from the wrong direction and can make a wrong decision. The reset phase timing, including delay $t_c$ depends on the settling of the capacitance network 501.

The Latch_enable signal of FIG. 8 may be coupled with the latch 204 to enable the latch 204 when the Latch_enable signal is high. Time delay, $t_d$, corresponds to the time period between the opening of the second reset switch 326 and the enabling of the latch 204. Time delay, $t_d$, sets the period available for the second amplifier 303 to amplify the signal received at first input of the second amplifier 303A and the second input of the first amplifier 303b.

The control signals corresponding to the 2nd Conversion Phase and the 1st Conversion are provided to a SAR Logic circuit and not depicted in a Figure.

Figure 9:
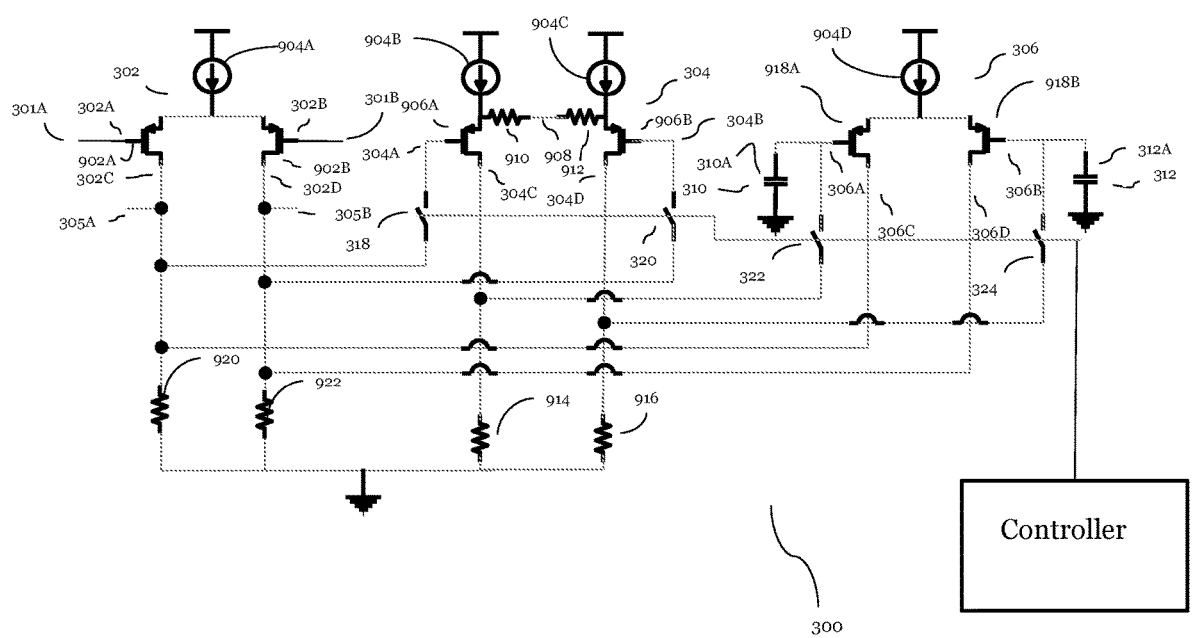
FIG. 9 illustrates an embodiment of an offset-cancellation circuit.

FIG. 9 illustrates an embodiment of an offset-cancellation circuit 300. FIG. 9 illustrates a transistor-level schematic of an embodiment the offset-cancellation circuit 300. In some embodiments, the first amplifier 302 comprises a first transistor of the first amplifier 902A and a second transistor of the first amplifier 902B.

In some embodiments, the first transistor of the first amplifier 902A comprises a PMOS transistor. In some embodiments, the second transistor of the first amplifier 902B comprises a PMOS transistor. The source of the first transistor of the first amplifier 902A may be coupled with a first current source 904A, and the source of the second transistor of the first amplifier 902B may be coupled with the first current source 904A.

In some embodiments, the gate of the first transistor of the first amplifier 902A may be coupled with the first input of the offset-cancellation circuit 301A and the gate of the second transistor of the first amplifier 902B may be coupled with the second input of the offset-cancellation circuit 301B. The current at the drain of the first transistor of the first amplifier 902A may be a function of the voltage at the first input of the offset-cancellation circuit 301A. The current at the drain of the second transistor of the first amplifier 902B may be a function of the voltage at the second input of the offset-cancellation circuit 301B.

In some embodiments, the pre-storage amplifier 304 comprises a first transistor of the pre-storage amplifier 906A and a second transistor of the pre-storage amplifier 906B. In some embodiments, the first transistor of the pre-storage amplifier 906A comprises a PMOS transistor. In some embodiments, the second transistor of the pre-storage amplifier 906B comprises a PMOS transistor. The source of the first transistor of the pre-storage amplifier 906A may be coupled with a second current source 904B, and the source of the second transistor of the pre-storage amplifier 906B may be coupled with a third current source 904C.

In some embodiments, a current path 908 between the source of the first transistor of the pre-storage amplifier 906A and the source of the second transistor of the pre-storage amplifier 906B includes a first resistor 910 and a second resistor 912. In some embodiments a third resistor 914 is disposed between the drain of the first transistor of the pre-storage amplifier 906A and a ground. A fourth resistor 916 may be disposed between the drain of the second transistor of the pre-storage amplifier 906B and a ground. In some embodiments, the offset cancellation circuit 300 may further comprise resistor 920 between the first output of the first amplifier 302C and a ground. In some embodiments, the offset cancellation circuit 300 may further comprise resistor 922 between the second output of the first amplifier 302D and a ground.

In some embodiments, the first pre-storage amplifier input 304A may be coupled with the gate of the first transistor of the pre-storage amplifier 906A and the second pre-storage amplifier input 304B may be coupled with the gate of the second transistor of the pre-storage amplifier 906B. In this way, the voltage at the first pre-storage amplifier input 304A may be applied to the gate of the first transistor of the pre-storage amplifier 906A. And, the voltage at the second pre-storage amplifier input 304B may be applied to the gate of the second transistor of the pre-storage amplifier 906B.

In some embodiments the first resistor 910 and the second resistor 912 have the same resistance, $R_s$. The third resistor 914 and the fourth resistor 916 may have the same resistance, $R_f$. In some embodiments, the voltage gain $A_1$ of the pre-storage amplifier 304 may be described by Equation 4:

$$A_1 = -R_f/R_s \qquad \text{(Equation 4)}$$

As described elsewhere, a first pre-storage switch 318, a second pre-storage switch 320, a third pre-storage switch 322, and a fourth pre-storage switch 324 may be toggled between open and closed states to isolate the pre-storage amplifier 304 from the offset-cancellation circuit 300 in the second state.

In some embodiments, the post-storage amplifier 306 comprises a first transistor of the post-storage amplifier 918A and a second transistor of the post-storage amplifier 918B. In some embodiments, the first transistor of the post-storage amplifier 918A comprises a PMOS transistor. In some embodiments, the second transistor of the post-storage amplifier 918B comprises a PMOS transistor. The source of the first transistor of the post-storage amplifier 918A may be coupled with a fourth current source 904D, and the source of the second transistor of the post-storage amplifier 918B may be coupled with the fourth current source 904D.

In some embodiments, the first post-storage amplifier input 306A may be coupled with the gate of the first transistor of the post-storage amplifier 918A and the second post-storage amplifier input 306B may be coupled with and the gate of the second transistor of the post-storage amplifier 918B. In this way, the voltage at the first post-storage amplifier input 306A may be applied to the gate of the first transistor of the post-storage amplifier 918A. And, the voltage at the second post-storage amplifier input 306B may be applied to the gate of the second transistor of the post-storage amplifier 918B.

In some embodiments, the pre-storage amplifier 304 is configured to cancel an offset introduced by the pre-storage amplifier. In some embodiments, the pre-storage amplifier 304 may be coupled to a common mode when the offset-cancellation circuit is in the second state and the pre-storage amplifier 304 is isolated from the offset-cancellation circuit 300. This may occur in some embodiments during a conversion phase of a SAR ADC.

Figure 10:
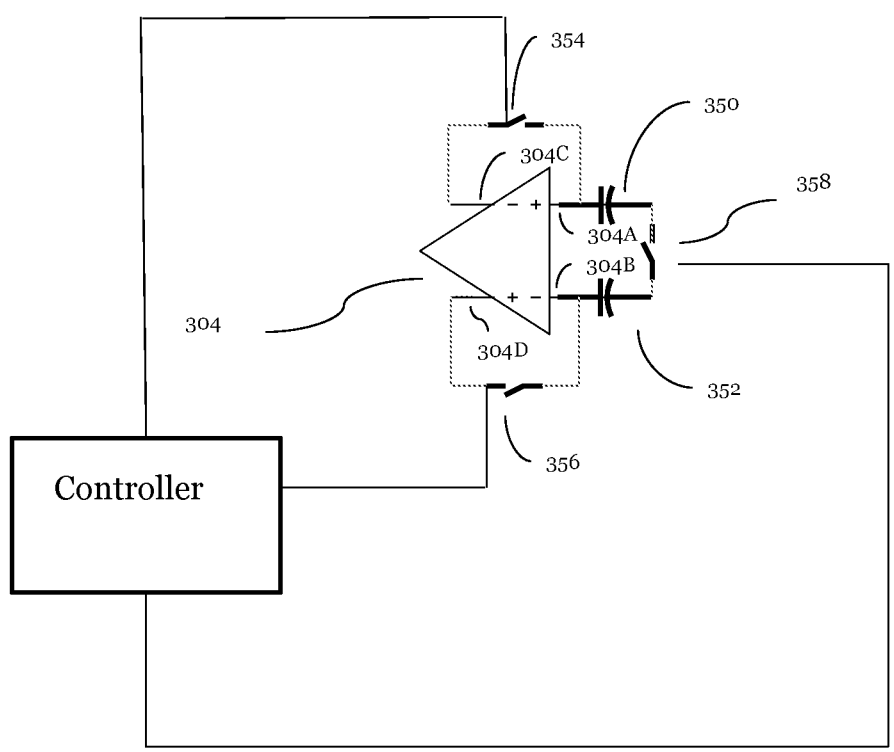
FIG. 10 illustrates an embodiment of a pre-storage amplifier.

FIG. 10 illustrates an embodiment of a pre-storage amplifier 304 configured for offset cancellation. The pre-storage amplifier 304 may be configured to be coupled to a common mode when isolated from the offset-cancellation circuit 300. A first pre-storage amplifier offset capacitor 350 may store an offset-cancellation potential and a second pre-storage amplifier offset capacitor 352 may store an offset-cancellation potential.

In some embodiments, in the second state the pre-storage amplifier 304 may be coupled to a common mode by a seventh pre-storage amplifier switch 358 coupling the first pre-storage amplifier input 304A to the second pre-storage amplifier input 304B. In some embodiments, one switch may be utilized to couple the first pre-storage amplifier input 304A to the common mode and a second switch may be utilized to couple the second pre-storage amplifier input 304B to a common mode.

In some embodiments, in the second state, the first pre-storage amplifier input 304A may be coupled with the first pre-storage amplifier output 304C by a fifth pre-storage amplifier switch 354. The second pre-storage amplifier input 304B may be coupled with the second pre-storage amplifier output 304D by a sixth pre-storage amplifier switch 356. This may allow the first pre-storage amplifier offset capacitor 350 to store an offset-cancellation potential and a second pre-storage amplifier offset capacitor 352 to store an offset-cancellation potential. The difference between the potentials stored on the first pre-storage amplifier offset capacitor 350 and the second pre-storage amplifier offset capacitor 352 being proportional to the input-offset of the pre-storage amplifier 304. The potentials on the first pre-storage amplifier offset capacitor 350 and the second pre-storage amplifier offset capacitor 352 may be applied to the pre-storage amplifier 304 when the offset-cancellation circuit is in the first state to cancel the offset of the pre-storage amplifier 304.

In some embodiments, the fifth pre-storage amplifier switch 354, the sixth pre-storage amplifier switch 356, and the seventh pre-storage amplifier switch 358 receive a control signal or control signals that toggle the switches between open and closed states.

Figure 11:
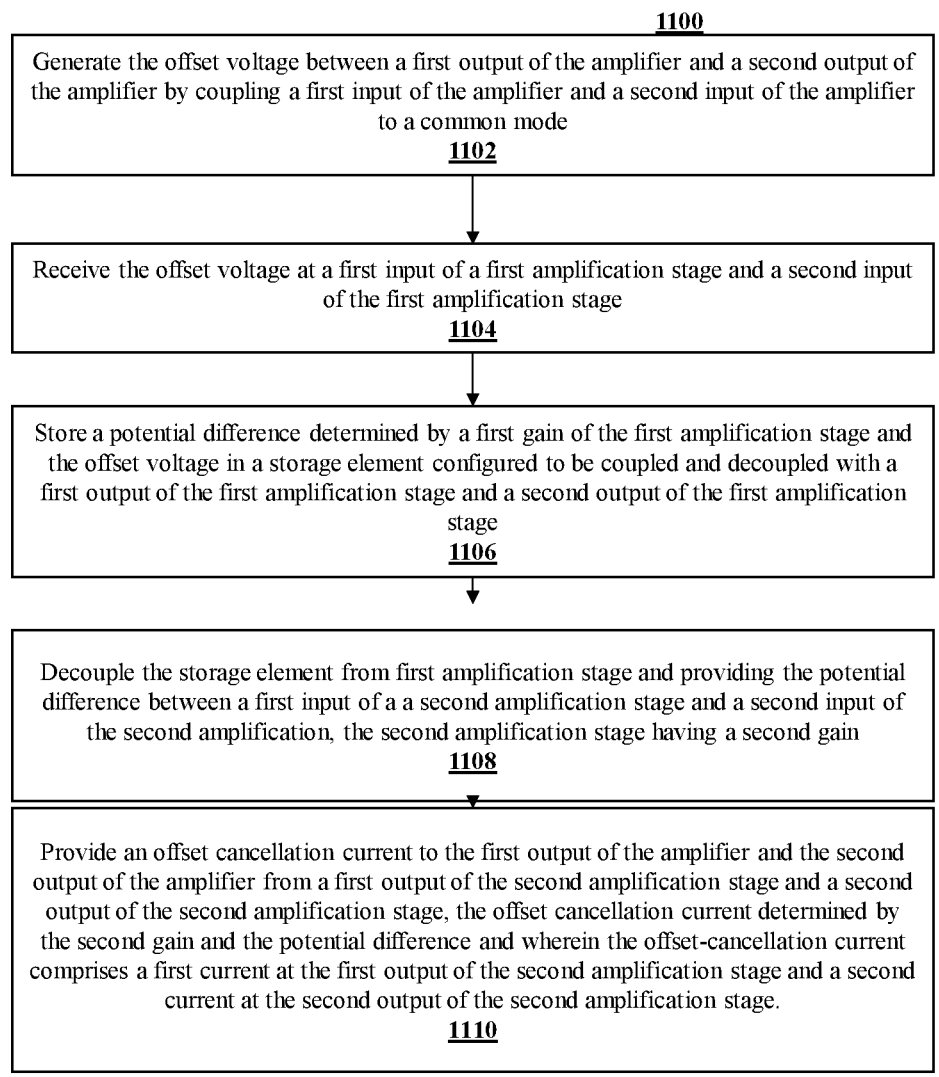
FIG. 11 illustrates a block diagram of an embodiment of a method to cancel an offset voltage of an amplifier.

FIG. 11 illustrates a block diagram of an embodiment of a method 1100 to cancel an offset voltage of an amplifier comprising at a step 1102, generating the offset voltage between a first output of the amplifier and a second output of the amplifier by coupling a first input of the amplifier and a second input of the amplifier to a common mode. In some embodiments, the method 1100 further comprises at a step 1104, receiving the offset voltage at a first input of a first amplification stage and a second input of the first amplification stage. At a step 1106, the method 1100 may comprise storing a potential difference determined by a first gain of the first amplification stage and the offset voltage in a storage element configured to be coupled and decoupled with a first output of the first amplification stage and a second output of the first amplification stage. In some embodiments, the method 1100 may comprise at a step 1108, decoupling the storage element from first amplification stage and providing the potential difference between a first input of a second amplification stage and a second input of the second amplification, the second amplification stage having a second gain. At a step 1110, the method 1100 may comprise providing an offset-cancellation current to the first output of the amplifier and the second output of the amplifier from a first output of the second amplification stage and a second output of the second amplification stage, the offset-cancellation current determined by the second gain and the potential difference and wherein the offset-cancellation current comprises a first current at the first output of the second amplification stage and a second current at the second output of the second amplification stage.

In some embodiments, the second amplification stage may comprise an operational transconductance amplifier and the second gain may comprise the transconductance of the operational transconductance amplifier.

In some embodiments of the method 1100, the storage element comprises a first capacitor and a second capacitor and wherein the storage element is configured to be coupled and decoupled with the first output of the first amplification stage by a first switch disposed between the first capacitor and the first output of the first amplification stage and the storage element is configured to be coupled and decoupled with the second output of the first amplification stage by a second switch disposed between the second capacitor and the second output of the first amplification stage.

In some embodiments of the method 1100, storing the potential difference at step 1106 further comprises storing a first potential on the first capacitor and storing second potential on the second capacitor the difference between the first potential and the second potential being equal to the potential difference.

In some embodiments of the method 1100, the first input of the first amplification stage is configured to be coupled and decoupled with the first output of the amplifier and the second input of the first amplification stage is configured to be coupled and decoupled with the second output of the amplifier.

In some embodiments, the method 1100 further comprises decoupling the first input of the first amplification stage from the first output of the amplifier and decoupling the second input of the first amplification stage from the second output of the amplifier.

In some embodiments of the method 1100, the first output of the amplifier is coupled to a first input of a second amplifier and the second output of the amplifier is coupled to a second input of the second amplifier; and a first output of the second amplifier is coupled to a first input of a latch and a second output of the second amplifier is coupled to a second input of the latch.

Example 1. An offset-cancellation circuit including: a first amplification stage including a gain of the first amplification stage and configured to receive an offset voltage of a first amplifier; a storage element configured to be coupled to and decoupled from the first amplification stage and configured to store a potential difference output by the first amplification stage, the potential difference being determined by the offset voltage of the first amplifier and the gain of the first amplification stage; and a second amplification stage coupled to the storage element and configured to receive the potential difference from the storage element when the storage element is decoupled from the first amplification stage and configured to deliver an offset-cancellation current, the offset-cancellation current being determined by the potential difference and a gain of the second amplification stage.

Example 2. The offset-cancellation circuit of example 1, where the offset voltage includes a difference between a first output of the first amplifier and a second output of the first amplifier when a first input of the first amplifier and a second input of the first amplifier are coupled to a common mode.

Example 3. The offset-cancellation circuit of examples 1 or 2, where the first input of the first amplifier is coupled to the common mode by a common mode switch.

Example 4. The offset-cancellation circuit of examples 1 to 3, further including a second amplifier and where a first input of the second amplifier is coupled to the first output of the first amplifier and a second input of the second amplifier is coupled to the second output of the first amplifier.

Example 5. The offset-cancellation circuit of examples 1 to 4, further including a latch coupled to a first output of the second amplifier and coupled to a second output of the second amplifier.

Example 6. The offset-cancellation circuit of examples 1 to 5, where a first input of the first amplification stage is coupled to the first output of the first amplifier and a second input of the first amplification stage coupled to the second output of the first amplifier to receive the offset voltage.

Example 7. The offset-cancellation circuit of examples 1 to 6, where the first input of the first amplification stage is configured to be decoupled from the first output of the first amplifier and the second input of the first amplification stage is configured to be decoupled from the second output of the first amplifier when the storage element is decoupled from the first amplification stage.

Example 8. The offset-cancellation circuit of examples 1 to 7, where a first output of the second amplification stage is coupled with the first output of the first amplifier and a second output of the second amplification stage is coupled with the second output of the first amplifier to deliver the offset-cancellation current and where the offset-cancellation circuit includes a first current at the first output of the second amplification stage and a second current at the second output of the second amplification stage.

Example 9. The offset-cancellation circuit of examples 1 to 8, where: the storage element includes a first capacitor and a second capacitor; and the second amplification stage includes: a first transistor including a gate, a drain, and a source, the gate of the first transistor being coupled to a first plate of the first capacitor, the drain of the first transistor being coupled to the first output of the second amplification stage, and the source of the first transistor being coupled to a current supply; and a second transistor including a gate, a drain, and a source, the gate of the second transistor being coupled to a first plate of the second capacitor, the drain of the second transistor being coupled to the second output of the second amplification stage, and the source of the second transistor being coupled to the current supply.

Example 10. The offset-cancellation circuit of examples 1 to 9, where the storage element is configured to be coupled to and decoupled from the first amplification stage by a first switch and a second switch, the first switch being disposed between a first output of the first amplification stage and the first plate of the first capacitor and the second switch being disposed between a second output of the first amplification stage and the first plate of the second capacitor.

Example 11. The offset-cancellation circuit of examples 1 to 10, where the first switch is configured to receive a first control signal to toggle the first switch between open and closed states and the second switch is configured to receive a second control signal to toggle the second switch between open and closed states.

Example 12. An offset-cancellation circuit including: an input amplifier including a first input, a second input, a first output, and a second output; a pre-storage amplifier including a first input and a second input; a post-storage amplifier including a first input coupled with a first plate of a first storage capacitor and including a second input coupled with a first plate of a second storage capacitor; where in a first state of the offset-cancellation circuit: the first input of the input amplifier and the second input of the input amplifier are coupled to a common mode to produce a voltage offset between the first output of the input amplifier and the second output of the input amplifier; the first input of the pre-storage amplifier is coupled to the first output of the input amplifier and the second input of the pre-storage amplifier is coupled to the second output of the input amplifier; the first plate of the first storage capacitor is coupled with a first output of the pre-storage amplifier and the first plate of the second storage capacitor is coupled with a second output of the pre-storage amplifier; and where a first potential is stored on the first storage capacitor and a second potential is stored on the second storage capacitor, a difference between the first potential and the second potential being proportional to the voltage offset; and where in a second state of the offset-cancellation circuit: the first plate of the first storage capacitor is decoupled from the first output of the pre-storage amplifier; the first plate of the second storage capacitor is decoupled from the second output of the pre-storage amplifier; and a first output of the post-storage amplifier is coupled with the first output of the input amplifier and a second output of the post-storage amplifier is coupled with the second output of the input amplifier to provide a first offset-cancellation current to the first output of the input amplifier and a second offset-cancellation current to the second output of the input amplifier, the first offset-cancellation current and the second offset-cancellation current determined by the first potential and by the second potential.

Example 13. The offset-cancellation circuit of example 12, further including: a first switch coupling the first plate of the first storage capacitor and the first output of the pre-storage amplifier in the first state and decoupling the first plate of the first storage capacitor and the first output of the pre-storage amplifier in the second state; and a second switch coupling the first plate of the second storage capacitor and the second output of the pre-storage amplifier in the first state and decoupling the first plate of the second storage capacitor and the second output of the pre-storage amplifier in the second state.

Example 14. The offset-cancellation circuit of examples 12 or 13, further including: a third switch coupling the first input of the pre-storage amplifier with the first output of the input amplifier in the first state and decoupling the first input of the pre-storage amplifier from the first output of the input amplifier in the second state; and a fourth switch coupling the second input of the pre-storage amplifier with the second output of the input amplifier in the first state and decoupling the second input of the pre-storage amplifier from the second output of the input amplifier in the second state.

Example 15. The offset-cancellation circuit of examples 12 to 14, further including a common mode switch operable to couple the first input of the input amplifier to the common mode.

Example 16. The offset-cancellation circuit of examples 12 to 15, where the common mode switch is operable to couple the second input of the input amplifier to the common mode.

Example 17. The offset-cancellation circuit of examples 12 to 16, further including a controller coupled with the first switch, the second switch, the third switch, the fourth switch, and the common mode switch where the controller is configured to toggle the first switch, the second switch, the third switch, the fourth switch, and the common mode switch between open and closed states.

Example 18. The offset-cancellation circuit of examples 12 to 17, where the input amplifier includes an operational transconductance amplifier, the pre-storage amplifier includes an operational amplifier, and the post-storage amplifier includes an operational transconductance amplifier.

Example 19. The offset-cancellation circuit of examples 12 to 18, further including an output amplifier where a first input of the output amplifier is coupled with the first output of the input amplifier and a second input of the output amplifier is coupled with the second output of the input amplifier.

Example 20. The offset-cancellation circuit of examples 12 to 19, where the output amplifier includes an operational amplifier.

Example 21. The offset-cancellation circuit of examples 12 to 20, further including a latch configured to compare a first voltage at a first output of the output amplifier with a second voltage at a second output of the output amplifier.

Example 22. A method to cancel an offset voltage of an amplifier including: generating the offset voltage between a first output of the amplifier and a second output of the amplifier by coupling a first input of the amplifier and a second input of the amplifier to a common mode; receiving the offset voltage at a first input of a first amplification stage and a second input of the first amplification stage; storing a potential difference determined by a first gain of the first amplification stage and the offset voltage in a storage element configured to be coupled and decoupled with a first output of the first amplification stage and a second output of the first amplification stage; decoupling the storage element from first amplification stage and providing the potential difference between a first input of a second amplification stage and a second input of the second amplification stage, the second amplification stage including a second gain; and providing an offset-cancellation current to the first output of the amplifier and the second output of the amplifier from a first output of the second amplification stage and a second output of the second amplification stage, the offset-cancellation current determined by the second gain and the potential difference and where the offset-cancellation current includes a first current at the first output of the second amplification stage and a second current at the second output of the second amplification stage.

Example 23. The method to cancel an offset voltage of an amplifier of example 22, where the first output of the amplifier is coupled to a first input of a second amplifier and the second output of the amplifier is coupled to a second input of the second amplifier; and a first output of the second amplifier is coupled to a first input of a latch and a second output of the second amplifier is coupled to a second input of the latch.

Example 24. The method to cancel an offset voltage of an amplifier of examples 22 or 23, where the storage element includes a first capacitor and a second capacitor and where the storage element is configured to be coupled and decoupled with the first output of the first amplification stage by a first switch disposed between the first capacitor and the first output of the first amplification stage and the storage element is configured to be coupled and decoupled with the second output of the first amplification stage by a second switch disposed between the second capacitor and the second output of the first amplification stage.

Example 25. The method to cancel an offset voltage of an amplifier of examples 22 to 24, where storing the potential difference includes storing a first potential on the first capacitor and storing a second potential on the second capacitor a difference between the first potential and the second potential being equal to the potential difference.

Example 26. The method to cancel an offset voltage of an amplifier of examples 22 to 25, where the first input of the first amplification stage is configured to be coupled and decoupled with the first output of the amplifier and the second input of the first amplification stage is configured to be coupled and decoupled with the second output of the amplifier.

Example 26. The method to cancel an offset voltage of an amplifier of examples 22 to 25, further including decoupling the first input of the first amplification stage from the first output of the amplifier and decoupling the second input of the first amplification stage from the second output of the amplifier.

This invention has been described with reference to illustrative embodiments; this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An analog-to-digital converter (ADC) comprising:
   a digital-to-analog converter (DAC);
   a comparator coupled to an output of the DAC; and
   a logic circuit configured to control the DAC based on an output of the comparator, wherein the comparator comprises:
   first and second inputs,
   a first transconductance amplifier having first and second inputs coupled to the first and second inputs of the comparator, respectively, and a first output coupled to the output of the comparator,
   a second amplifier having a first input coupled to the first output of the first transconductance amplifier,
   a third transconductance amplifier having a first input coupled to a first output of the second amplifier, and a first output coupled to the first output of the first transconductance amplifier, and
   a capacitive element coupled to the first input of the third transconductance amplifier and to the first output of the second amplifier, wherein, during a sample mode of the ADC, the ADC is configured to couple the first and second inputs of the comparator to a common mode node to generate an offset voltage with first transconductance amplifier, and store a scaled offset voltage in the capacitive element with the second amplifier, wherein the scaled offset voltage is based on the offset voltage and a gain of the second amplifier, and wherein, during a conversion mode of the ADC, the ADC is configured to apply a first current to the first output of the first transconductance amplifier with the third transconductance amplifier, wherein the first current is based on the scaled offset voltage stored in the capacitive element.

2. The ADC of claim 1, wherein the first transconductance amplifier comprises a second output coupled to a second input of the second amplifier, wherein the second amplifier comprises a second output coupled to a second input of the third transconductance amplifier, wherein the third transconductance amplifier comprises a second output coupled to the second output of the first transconductance amplifier, wherein the capacitive element comprises a first capacitor coupled to the first output of the second amplifier and a second capacitor coupled to the second output of the second amplifier, wherein, during the sample mode, the ADC is configured to store the scaled offset voltage in the first and second capacitors, and wherein, during the conversion mode, the ADC is configured to apply a second current to the second output of the first transconductance amplifier with the third transconductance amplifier, wherein the first and second currents are based on the scaled offset voltage stored in the first and second capacitors.

3. The ADC of claim 2, further comprising:
   a fourth amplifier having first and second inputs coupled to the first and second outputs of the first transconductance amplifier; and
   a latch having first and second inputs coupled to first and second outputs of the fourth amplifier and an output coupled to the output of the comparator.

4. The ADC of claim 2, further comprising:
   a first switch coupled between the first output of the first transconductance amplifier and the first input of the second amplifier;
   a second switch coupled between the second output of the first transconductance amplifier and the second input of the second amplifier;
   a third switch coupled between the first output of the second amplifier and the first input of the third transconductance amplifier; and
   a fourth switch coupled between the second output of the second amplifier and the second input of the third transconductance amplifier, wherein the first, second, third, and fourth switches are configured to be closed during the sample mode and open during the conversion mode.

5. The ADC of claim 1, further comprising a fourth amplifier having a first input coupled to the first output of the first transconductance amplifier, and a first output coupled to the output of the comparator.

6. The ADC of claim 5, further comprising a latch having a first input coupled to the first output of the fourth amplifier, and an output coupled to the output of the comparator.

7. The ADC of claim 1, further comprising a first switch coupled to the first input of the comparator, wherein coupling the first and second inputs of the comparator to the common mode node comprises closing the first switch, and wherein the first switch is configured to be open during the conversion mode.

8. The ADC of claim 7, further comprising a second switch coupled between the second input of the comparator and the common mode node, wherein coupling the first and second inputs of the comparator to the common mode node further comprises closing the second switch, and wherein the second switch is configured to be open during the conversion mode.

9. The ADC of claim 1, further comprising a first switch coupled between the first output of the first transconductance amplifier and the first input of the second amplifier, wherein the first switch is configured to be closed during the sample mode, and open during the conversion mode.

10. The ADC of claim 1, further comprising a first switch coupled between the first output of the second amplifier and the first input of the third transconductance amplifier, wherein the first switch is configured to be closed during the sample mode, and open during the conversion mode.

11. The ADC of claim 1, further comprising a sample and hold circuit having an output coupled to the first input of the comparator, wherein the output of the DAC is coupled to the second input of the comparator.

12. The ADC of claim 1, further comprising a sample and hold circuit comprising a capacitor network, and wherein the DAC comprises the capacitor network.

13. The ADC of claim 1, wherein the ADC is a successive approximation register (SAR) ADC.

14. A comparator comprising:
first and second inputs and an output,
a first transconductance amplifier having first and second inputs coupled to the first and second inputs of the comparator, respectively, and a first output coupled to the output of the comparator;
a second amplifier having a first input coupled to the first output of the first transconductance amplifier;
a third transconductance amplifier having a first input coupled to a first output of the second amplifier, and a first output coupled to the first output of the first transconductance amplifier; and
a capacitive element coupled to the first input of the third transconductance amplifier and to the first output of the second amplifier, wherein, during a first mode of the comparator, the comparator is configured to couple the first and second inputs of the comparator to a common mode node to generate an offset voltage with first transconductance amplifier, and store a scaled offset voltage in the capacitive element with the second amplifier, wherein the scaled offset voltage is based on the offset voltage and a gain of the second amplifier, and wherein, during a second mode of the comparator, the comparator is configured to apply a first current to the first output of the first transconductance amplifier with the third transconductance amplifier, wherein the first current is based on the scaled offset voltage stored in the capacitive element.

15. The comparator of claim 14, wherein the first transconductance amplifier comprises a second output coupled to a second input of the second amplifier, wherein the second amplifier comprises a second output coupled to a second input of the third transconductance amplifier, wherein the third transconductance amplifier comprises a second output coupled to the second output of the first transconductance amplifier, wherein the capacitive element comprises a first capacitor coupled to the first output of the second amplifier and a second capacitor coupled to the second output of the second amplifier, wherein, during the first mode, the comparator is configured to store the scaled offset voltage in the first and second capacitors, and wherein, during the second mode, the comparator is configured to apply a second current to the second output of the first transconductance amplifier with the third transconductance amplifier, wherein the first and second currents are based on the scaled offset voltage stored in the first and second capacitors.

16. The comparator of claim 15, further comprising:
a fourth amplifier having first and second inputs coupled to the first and second outputs of the first transconductance amplifier; and
a latch having first and second inputs coupled to first and second outputs of the fourth amplifier and an output coupled to the output of the comparator.

17. The comparator of claim 15, further comprising:
a first switch coupled between the first output of the first transconductance amplifier and the first input of the second amplifier;
a second switch coupled between the second output of the first transconductance amplifier and the second input of the second amplifier;
a third switch coupled between the first output of the second amplifier and the first input of the third transconductance amplifier; and
a fourth switch coupled between the second output of the second amplifier and the second input of the third transconductance amplifier, wherein the first, second, third, and fourth switches are configured to be closed during the first mode and open during the second mode.

18. A method for operating an analog-to-digital converter (ADC), the method comprising:
during a sample mode of the ADC,
sampling an input voltage,
receiving a common mode voltage at a common mode node,
coupling first and second inputs of a comparator to the common mode node,
generating an offset voltage with a first transconductance amplifier of the comparator, the first transconductance amplifier having first and second inputs coupled to the first and second inputs of the comparator, and an output coupled to an output of the comparator, and
storing a scaled offset voltage in a capacitive element with a second amplifier of the comparator, wherein the scaled offset voltage is based on the offset voltage and a gain of the second amplifier; and
during a conversion mode of the ADC,
injecting a current to the output of the first transconductance amplifier based on the scaled offset voltage stored in the capacitive element, and
controlling a digital-to-analog converter (DAC) based on the output of the comparator to cause a DAC output voltage at an output of the DAC to approximate the sampled input voltage.

19. The method of claim 18, wherein coupling the first and second inputs of the comparator to the common mode node comprises closing a first switch coupled between the first input of the comparator and the common mode node, and closing a second switch coupled between the second input of the comparator and the common mode node, wherein the first and second switches are open during conversion mode.

20. The method of claim 18, wherein the capacitive element is decoupled from the output of the second amplifier during the conversion mode.

* * * * *